(12) United States Patent
Tong et al.

(10) Patent No.: US 7,723,165 B2
(45) Date of Patent: May 25, 2010

(54) METHOD OF FORMING COMPONENT PACKAGE

(75) Inventors: Soon Hock Tong, Melaka (MY); Wae Chet Yong, Melaka (MY); Stanley Job Doraisamy, Kuala Lumpur (MY)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/049,276

(22) Filed: Mar. 15, 2008

(65) Prior Publication Data

US 2008/0160677 A1      Jul. 3, 2008

Related U.S. Application Data

(63) Continuation of application No. PCT/SG2005/000362, filed on Oct. 19, 2005.

(51) Int. Cl.
*H01L 21/50*      (2006.01)

(52) U.S. Cl. .................... 438/127; 438/124; 438/125; 438/126; 257/678; 257/E23.051; 257/E21.502

(58) Field of Classification Search ......... 438/123–127; 257/666–677, 678–987
See application file for complete search history.

(56) References Cited

U.S. PATENT DOCUMENTS

| | | | |
|---|---|---|---|
| 5,989,940 A | 11/1999 | Nakajima | |
| 6,441,484 B2 * | 8/2002 | Koyama et al. | 257/724 |
| 6,982,479 B2 | 1/2006 | Nishijima et al. | |
| 2004/0026776 A1 | 2/2004 | Brand | |
| 2004/0061244 A1 | 4/2004 | Nishijima et al. | |
| 2004/0065945 A1 | 4/2004 | Smith | |
| 2008/0290484 A1 * | 11/2008 | Low et al. | 257/675 |

FOREIGN PATENT DOCUMENTS

| | | |
|---|---|---|
| EP | 1 403 926 A2 | 3/2004 |
| JP | 11097469 A | 4/1999 |

* cited by examiner

*Primary Examiner*—Dung A. Le
(74) *Attorney, Agent, or Firm*—Slater & Matsil, L.L.P.

(57) ABSTRACT

There is provided a method of forming a component package. The method includes the steps of providing the die pad or heat sink, forming an isolation layer on the rear surface of the die pad or heat sink and encapsulating the die pad with encapsulating material in a mold cavity after forming the isolation layer on the rear of the die pad or heat sink.

19 Claims, 1 Drawing Sheet

METHOD OF FORMING COMPONENT PACKAGE

This application is a continuation of co-pending International Application No. PCT/SG2005/000362, filed Oct. 19, 2005, which designated the United States and was published in English, of which application is incorporated herein by reference.

TECHNICAL FIELD

The present invention relates to a method of forming a component package, and in particular to the formation of a component package in which an isolation layer is provided on the heat sink or die pad.

BACKGROUND

Component packages typically comprise a die pad or heat sink which supports the component, for example, in the form of a semiconductor chip. The die pad or heat sink and components are encapsulated in a resin material. This is generally achieved by locating the die pad and components within a mold cavity, and injecting or introducing resin material into the mold cavity. By surrounding the die pad or heat sink with resin material, an isolation layer is formed on the rear surface of the die pad.

The problem with this known method is that the die pad or heat sink may move within the mold cavity during injection of the encapsulating material, and accordingly it becomes difficult to reproduce a highly accurate isolation layer thickness on the rear of the heat sink. To try and overcome this problem, it has been proposed to maintain the position of the die pad or heat sink within the mold cavity, for example, using one or more pins which hold the die pad or heat sink in position. In one example, the pins are retractable, such that these are removed during the molding process. However, such retractable pins are liable to wear, and therefore regularly need replacing. Further, the retraction of the pins must be carefully controlled to ensure that the encapsulating material fills the spaces from which the pins were retracted. The difficulty in accurately timing the retraction of the pins may result in a highly inconsistent outcome of the product. Where the pins are fixed, it is necessary to remove the pins after initial molding, and to then fill the hole left by the pins. Typically, the material used to fill these holes is not the same as the mold compound, leading to a possible material mismatch.

SUMMARY OF THE INVENTION

According to embodiments of the present invention, a method of forming a component package comprises providing the die pad or heat sink, and forming an isolation layer on the rear surface of the die pad or heat sink prior to encapsulating the die pad with encapsulating material in the mold cavity. By forming the isolation layer on the rear of the die pad or heat sink prior to encapsulation of the device, it is possible to accurately form an isolation layer of known and consistent thickness. Accordingly, it is then less important whether the die pad or heat sink moves during the final encapsulation process.

The isolation layer should be formed from insulating material, and is preferably formed from the same material as the mold compound used to encapsulate the device. This ensures that there is no mismatch between the materials which may affect the electrical properties, as well as the physical properties, of the device.

It is also preferred that the isolation layer is formed by a molding process, preferably by a transfer molding process.

It will be appreciated that the die pad or heat sink with the preformed isolation layer may be held within the mold cavity during the final encapsulate using either fixed or retractable pins as is known in the prior art.

BRIEF DESCRIPTION OF THE DRAWINGS

Embodiments of the present invention will be described, by way of example, with reference to the accompanying drawings, in which.

DETAILED DESCRIPTION OF ILLUSTRATIVE EMBODIMENTS

Figure 1:
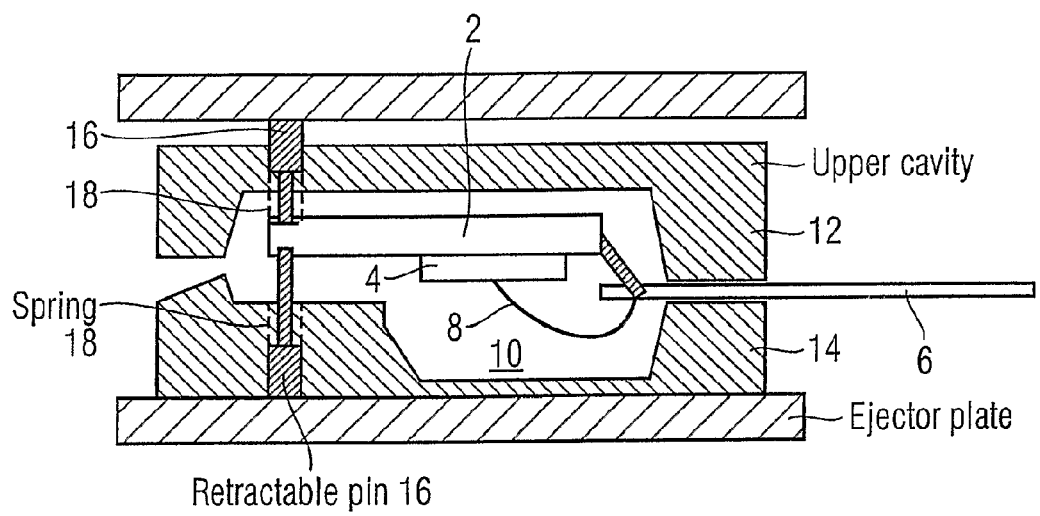
FIG. 1 shows a cross-sectional view of a mold for encapsulating the device according to the prior art.

FIG. 1 shows a cross-section of a mold apparatus for encapsulating a die pad 2 and component 4 according to a prior art method. The apparatus comprises an upper mold element 12 and a lower mold element 14 defining between them a mold cavity 10. The lower mold element 14 is provided on an ejector plate, and the die pad 2, on which the component 4 is mounted is held within the mold cavity 10. Electrical contacts 8 connect the component 4 to an end of leads 6, which also support the die pad or heat sink 2. The upper mold element 12 is located over the lower mold element 14 to define the mold cavity 10. The end of the die pad 2 not supported by the inner end of the leads 6 is supported by a pair of retractable pins 16, each of which are spring biased by spring 18. The two retractable pins 16 support the free end of the die pad 2 from above and below to hold this in place:

Mold compound is injected into the mold cavity 10, surrounding all sides of the die pad 2, component 4, contacts 8 and leads 6. As the mold compound is introduced, the retractable pins 16 are retracted to enable the mold compound to completely fill the cavity.

During the filling of the mold cavity, there is a risk that the die pad 2 will move. Accordingly, the thickness of mold material on the rear of the die pad 2 as shown in FIG. 1 may not be consistent across the entire surface of the die pad 2. This may result in undesirable electrical and mechanical properties of the finished package.

Figure 2:
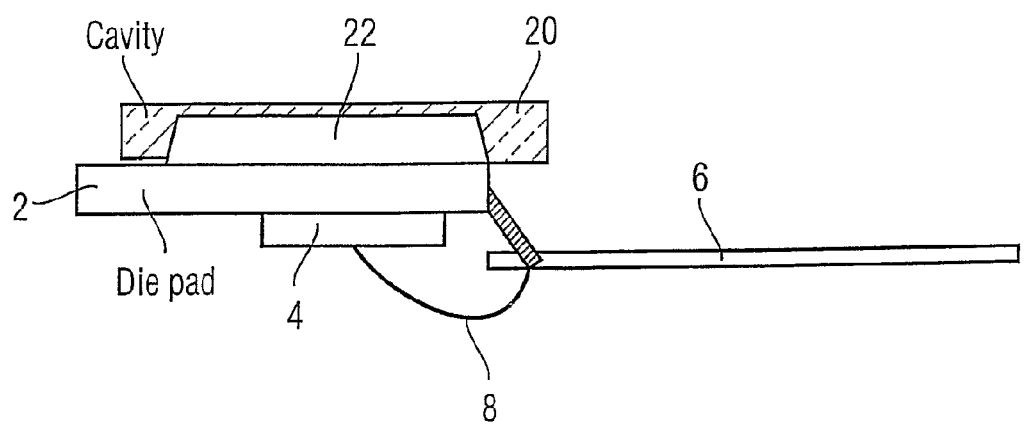
FIG. 2 shows the pre-molding of an isolation layer according to the present invention.

The present invention is illustrated in FIG. 2. As can be seen, the die pad or heat sink 2 is formed with the component 4 provided on one surface, with electrical contacts between the component 4 and the inner end of leads 6, and with one end of the die pad or heat sink 2 supported by the inner end of the leads 6. However, prior to introduction of the die pad or heat sink 2 and component 4 into a mold cavity, an isolation layer 22 is formed on the rear of the die pad 2. This isolation layer 22 is formed on the rear of the die pad or heat sink 2 by a transfer molding technique. In particular, the isolation layer 22 is formed in a mold cavity 20, and is then provided on the rear of the die pad or heat sink 2. In this way, an isolation layer of uniform thickness and properties can be formed on the rear of the die pad or heat sink 2.

After forming the isolation layer 22 on the rear of the die pad or heat sink 2, the resulting device may be provided in a mold cavity and mold compound can be injected around the resulting device in a manner known from the prior art. Ideally, the mold compound used to encapsulate the device is of the same material as the isolation layer to ensure optimum mechanical and electrical properties of the resulting device.

What is claimed is:

1. A method of forming a component package, the method comprising:
   providing a die pad or heat sink;
   forming an isolation layer on a rear surface of the die pad or heat sink; and
   encapsulating the die pad or heat sink with encapsulating material in a mold cavity after forming the isolation layer on the rear surface of the die pad or heat sink.

2. The method according to claim 1, wherein the isolation layer comprises an insulating material.

3. The method according to claim 2, wherein the isolation material is formed from the same material as the encapsulating material.

4. The method according to claim 1, wherein the isolation material is formed from the same material as the encapsulating material.

5. The method according to claim 1, wherein forming the isolation layer comprises performing a molding process.

6. The method according to claim 5, wherein forming the isolation layer comprises performing a transfer molding process.

7. The method according to claim 1, wherein encapsulating the die pad or heat sink comprises supporting the die pad or heat sink by pins within the mold cavity.

8. The method according to claim 7, wherein the pins are retracted during encapsulation.

9. A method of forming a packaged semiconductor device, the method comprising:
   providing a die pad or heat sink;
   mounting a semiconductor chip on a front surface of the die pad or heat sink;
   forming an isolation layer on a rear surface of the die pad or heat sink, the rear surface opposite the front surface;
   encapsulating the die pad or heat sink with encapsulating material in a mold cavity after forming the isolation layer on the rear surface of the die pad or heat sink.

10. The method according to claim 9, wherein the semiconductor chip is mounted on the die pad or heat sink before forming the isolation layer.

11. The method according to claim 9, wherein the isolation layer comprises an insulating material.

12. The method according to claim 11, wherein the isolation material is formed from the same material as the encapsulating material used to encapsulate the device.

13. The method according to claim 9, wherein the isolation material is formed from the same material as the encapsulating material used to encapsulate the device.

14. The method according to claim 9, wherein forming the isolation layer comprises performing a molding process.

15. The method according to claim 14, wherein forming the isolation layer comprises performing a transfer molding process.

16. The method according to claim 9, wherein encapsulating the die pad or heat sink comprises supporting the die pad or heat sink by pins within the mold cavity.

17. The method according to claim 16, wherein the pins are retracted during encapsulation.

18. The method according to claim 9, wherein the die pad or heat sink is a die pad.

19. The method according to claim 18, wherein the die pad serves as a heat sink.

* * * * *